United States Patent
Chen et al.

(10) Patent No.: US 11,205,738 B2
(45) Date of Patent: Dec. 21, 2021

(54) BACK PLATE AND METHOD FOR FLUID-ASSISTED ASSEMBLY OF MICRO-LEDS THEREON

(71) Applicant: ADVANCED OPTOELECTRONIC TECHNOLOGY, INC., Hsinchu Hsien (TW)

(72) Inventors: Shiue-Lung Chen, Hsinchu (TW); Cheng-Kuo Feng, Hsinchu (TW)

(73) Assignee: ADVANCED OPTOELECTRONIC TECHNOLOGY, INC., Hsinchu Hsien (TW)

(*) Notice: Subject to any disclaimer, the term of this patent is extended or adjusted under 35 U.S.C. 154(b) by 0 days.

(21) Appl. No.: 16/916,011

(22) Filed: Jun. 29, 2020

(65) Prior Publication Data

US 2021/0359153 A1 Nov. 18, 2021

(30) Foreign Application Priority Data

May 15, 2020 (CN) .......................... 202010414603.1

(51) Int. Cl.
*H01L 33/00* (2010.01)
*H01L 25/075* (2006.01)

(52) U.S. Cl.
CPC .......... *H01L 33/005* (2013.01); *H01L 25/075* (2013.01); *H01L 2933/0066* (2013.01)

(58) Field of Classification Search
CPC ................ H01L 33/005; H01L 25/075; H01L 2933/0066
See application file for complete search history.

(56) References Cited

U.S. PATENT DOCUMENTS 7,727,804 B2 * 6/2010 Smith .................... H01L 24/82
438/107
2018/0309023 A1 10/2018 Crowder et al.

* cited by examiner

*Primary Examiner* — David Vu
(74) *Attorney, Agent, or Firm* — ScienBiziP, P.C.

(57) ABSTRACT

A back plate for rapid and fluid-assisted assembly of micro light emitting elements thereon includes a substrate with a driving circuit, and blocking walls made to protrude from a top surface of the substrate. The top surface of the substrate defines grooves for accommodating and powering micro light emitting elements. Each of the blocking walls semi-surrounds one groove and defines a notch. The notches defined by each blocking wall all face a single direction and the blocking walls and notches impede and gather micro light emitting elements which are made to flow in a fluid suspension and render them much more likely to tumble into the groove. A method for fluid-assisted assembly is also disclosed.

9 Claims, 15 Drawing Sheets

BACK PLATE AND METHOD FOR FLUID-ASSISTED ASSEMBLY OF MICRO-LEDS THEREON

FIELD

The subject matter herein generally relates to semiconductor assemblies, specifically a back plate, and a method for ease of assembly.

BACKGROUND

A method for fluid-assisted assembly is a method of assembling tiny elements (e.g., light emitting diodes). In this method, a substrate defining a plurality of grooves is placed in a suspension with a plurality of micro light emitting elements, the micro light emitting elements move with flowing liquid, and fall into the grooves of the substrate.

However, in the current structure of the substrate and the method of fluid assembling the substrate, a probability of the micro light emitting elements actually falling into the grooves is low, and thus assembly time is long.

Therefore, there is room for improvement in the art.

BRIEF DESCRIPTION OF THE DRAWINGS

Implementations of the present disclosure will now be described, by way of embodiment, with reference to the attached figures.

DETAILED DESCRIPTION

It will be appreciated that for simplicity and clarity of illustration, where appropriate, reference numerals have been repeated among the different figures to indicate corresponding or analogous elements. In addition, numerous specific details are set forth in order to provide a thorough understanding of the exemplary embodiments described herein. However, it will be understood by those of ordinary skill in the art that the exemplary embodiments described herein may be practiced without these specific details. In other instances, methods, procedures, and components have not been described in detail so as not to obscure the related relevant feature being described. Also, the description is not to be considered as limiting the scope of the exemplary embodiments described herein. The drawings are not necessarily to scale and the proportions of certain parts may be exaggerated to better illustrate details and features of the present disclosure.

The term "comprising" when utilized, means "including, but not necessarily limited to"; it specifically indicates open-ended inclusion or membership in the so-described combination, group, series, and the like. The disclosure is illustrated by way of example and not by way of limitation in the figures of the accompanying drawings in which like references indicate similar elements. It should be noted that references to "an" or "one" embodiment in this disclosure are not necessarily to the same embodiment, and such references can mean "at least one". The term "circuit" is defined as an integrated circuit (IC) with a plurality of electric elements, such as capacitors, resistors, amplifiers, and the like.

Figure 1:
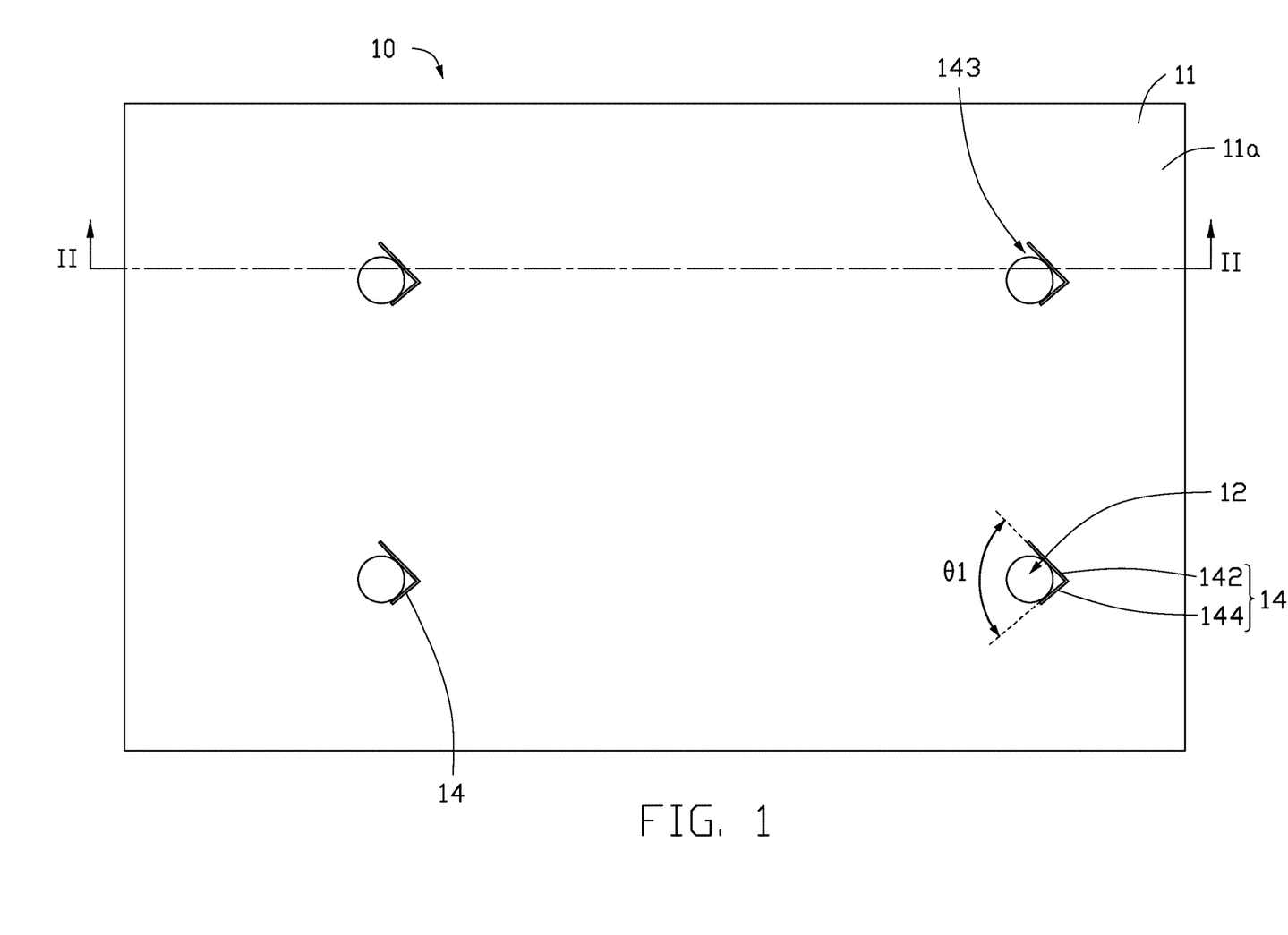
FIG. 1 is a top view of a back plate according to an embodiment.
Figure 2:
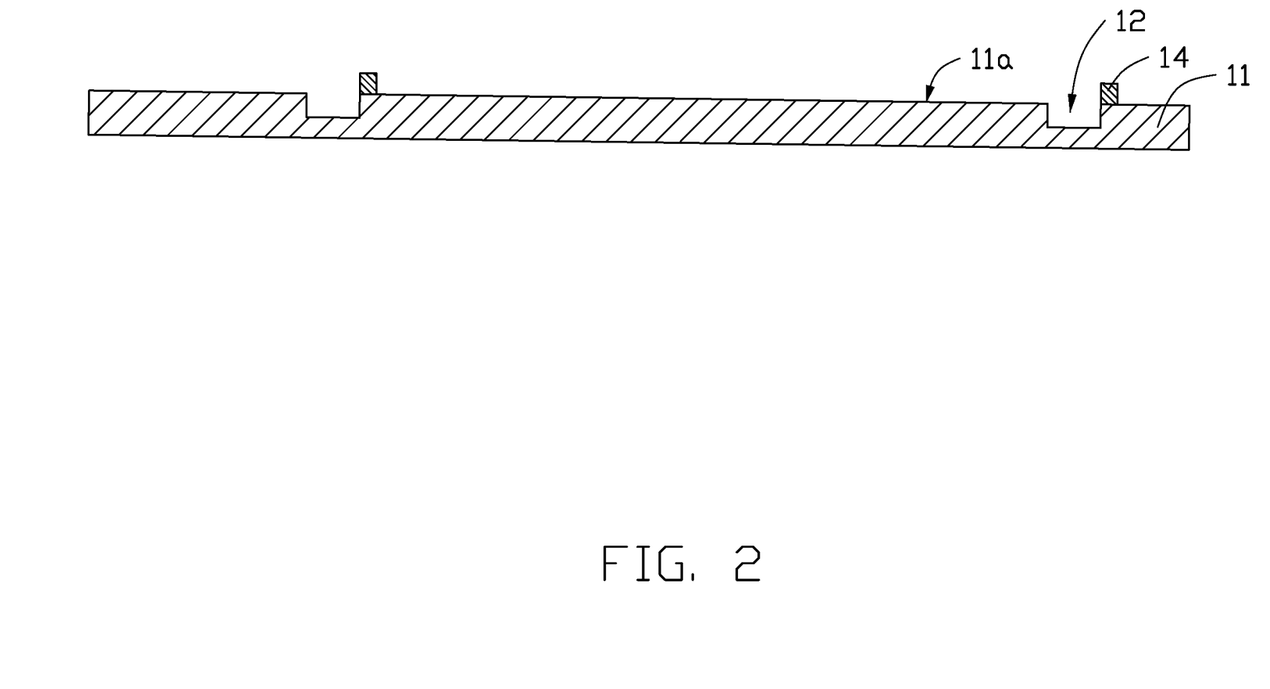
FIG. 2 is a cross-sectional view along line II-II of FIG. 1.

FIGS. 1 and 2 show a back plate 10 according to an embodiment. The back plate 10 includes a substrate 11 and a plurality of blocking walls 14 protruding from a top surface 11a of the substrate 11. The top surface 11a of the substrate 11 defines a plurality of grooves 12 for accommodating micro light emitting elements 16. Each of the blocking walls 14 partially surrounds one of the grooves 12 and defines a notch 143. The notches 143 defined by each of the plurality of blocking walls 14 each face a single direction.

In one embodiment, the micro light emitting element 16 is a micro light emitting diode (micro LED). "Micro LED" means LED with a grain size less than 100 microns. A size and shape of each groove 12 match a size and shape of one the micro light emitting element 16.

In one embodiment, each of the blocking walls 14 includes a first blocking wall portion 142 and a second blocking wall portion 144 connected to the first blocking wall portion 142. The first blocking wall portion 142 and the second blocking wall portion 144 are adjacent to one of the grooves 12 and intersect to form one notch 143. Referring to FIG. 1, the first blocking wall portion 142 and the second blocking wall portion 144 intersect in a "V" shape. A direction of the notch 143 of each of the blocking walls 14 is a direction of the V-shaped notch 143. An intersection angle θ1 of each of the blocking walls 14 ranges from 45 degrees to 120 degrees.

In other embodiments, each of the blocking walls 14 may have another shape to semi-surround one of the grooves 12, for example, an arc shape. The first blocking wall portion 142 and the second blocking wall portion 144 may have another shape and are not limited to being in a strip shape.

In one embodiment, along a thickness direction of the substrate 11, a height H1 (labeled in FIG. 15) of the blocking wall 14 is greater than half of a height H2 (labeled in FIG. 15) of the micro-light emitting element 16. Therefore, during a fluid-assisted assembly process, the micro light emitting elements 16 can be blocked by the blocking walls 14 and fall into the grooves 12.

In one embodiment, each of the grooves 12 is substantially cylindrical. A distance between adjacent grooves 12 is not less than twice the diameter of each of the grooves 12. Since one side of each groove 12 of the back plate 10 is provided with one of the blocking walls 14, the micro light emitting elements 16 must be blocked during the fluid-assisted assembly process. A probability of the micro-light emitting elements 16 entering the grooves 12 is increased, the assembly time is reduced. The spacing between the grooves 12 (for example, the spacing between adjacent grooves 12 exceeds twice the diameter of the grooves 12) is fundamental for a higher hole penetration rate, and assembly time is made more efficient by the success rate.

In one embodiment, the substrate 11 includes a base layer (not shown), a driving circuit (not shown), and an insulating layer (not shown) stacked in said sequence. The insulating layer defines a plurality of through holes (i.e., grooves 12) exposing the driving circuit. The micro light emitting element 16 falling into the through hole (i.e., the groove 12) of the insulating layer becomes electrically connected to the driving circuit. The driving circuit drives the micro light emitting element 16 to emit light.

Figure 3:
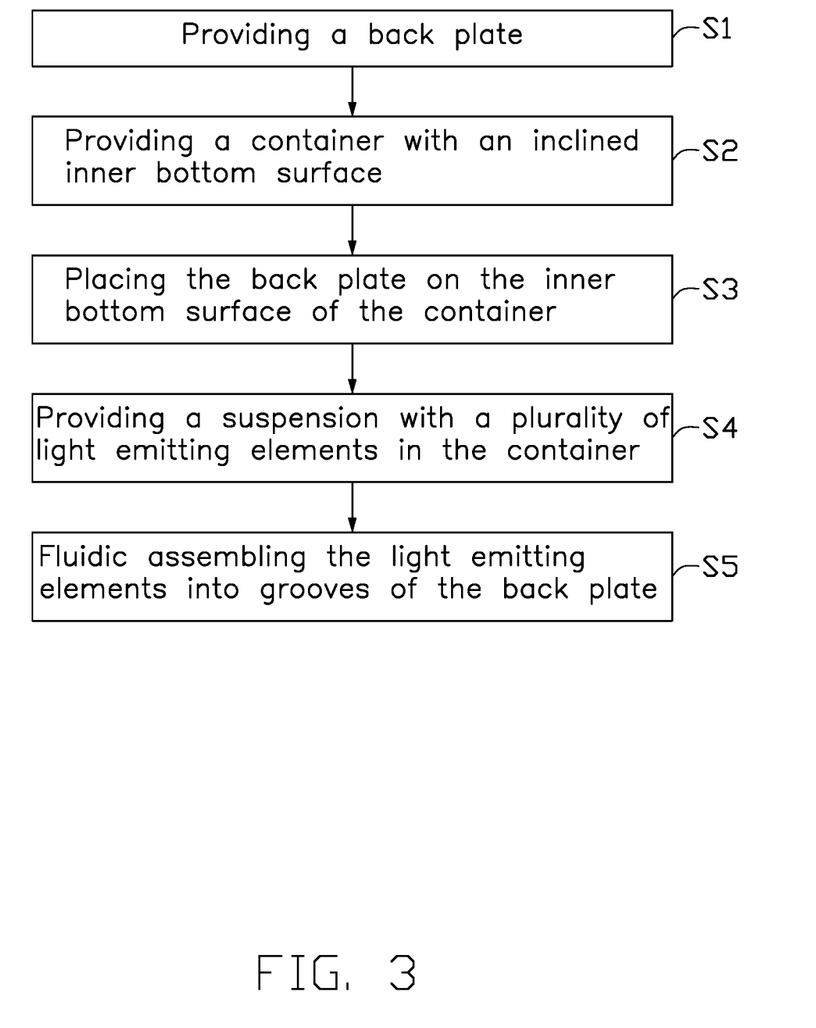
FIG. 3 is a flowchart of a method for fluid-assisted assembly according to an embodiment.

Referring to FIG. 3, a flowchart of a method for assembling the light-emitting elements in one embodiment is disclosed. This method is used for assembling micro light emitting elements on a back plate. The method is provided by way of embodiment, as there are a variety of ways to carry out the method. The method described below can be carried out using the configurations illustrated in FIGS. 4 through 15 for example, and various elements of these figures are referenced in explaining the method. Each block shown in FIG. 3 represents one or more processes, methods, or subroutines, carried out in the method. Additionally, the illustrated order of blocks is by example only and the order of the blocks can change. The method can begin at Block S1.

S1: the back plate 10 shown in FIGS. 1 and 2 is provided.

S2: a container 22 having an inclined inner bottom surface 22a is provided.

Figure 4:
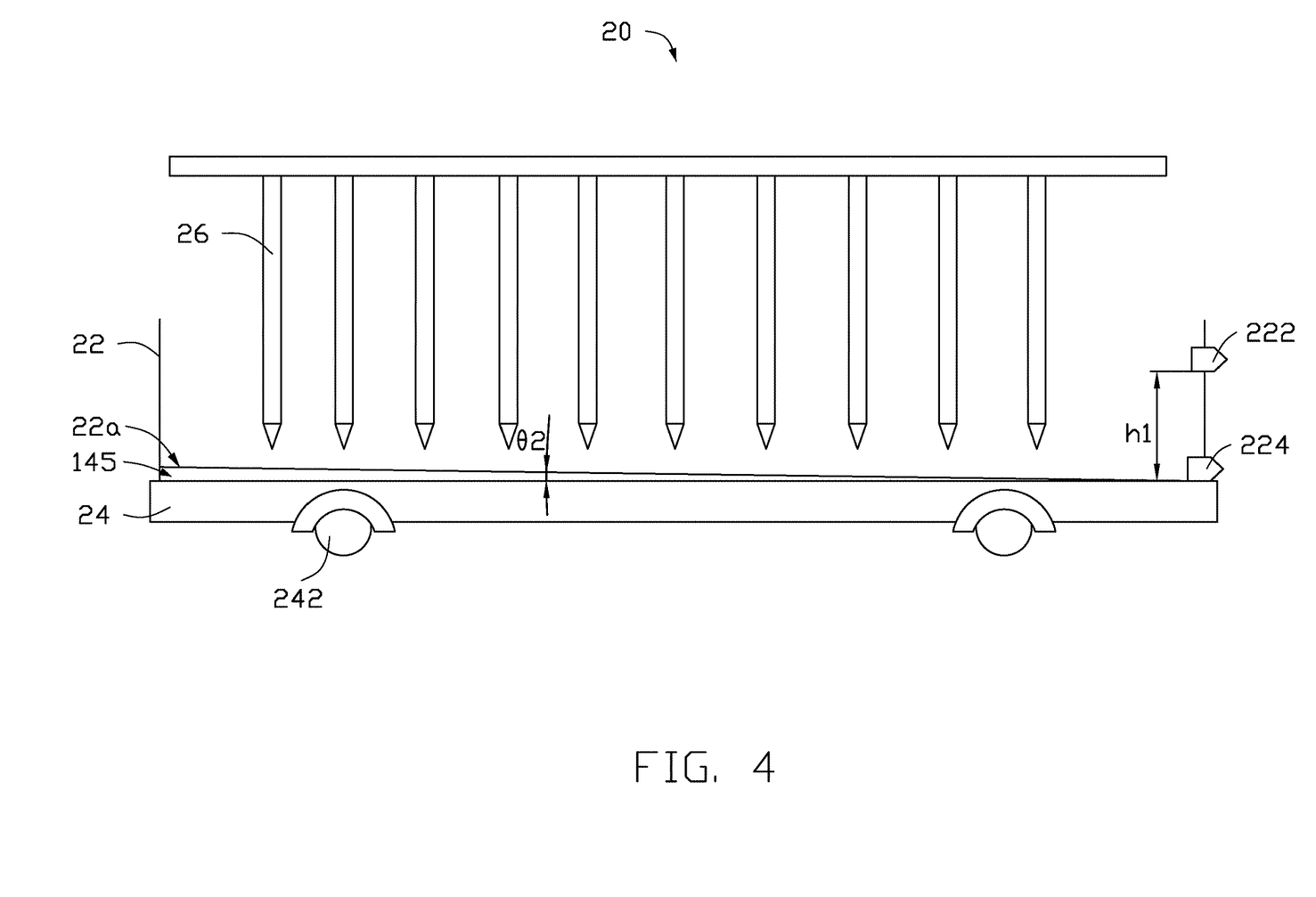
FIG. 4 is an isometric view showing Block S2 of the method in FIG. 3.

In one embodiment, Block S2 includes providing an assembling device 20 for a back plate. As shown in FIG. 4, the assembling device 20 includes a bracket 24, the container 22 on the bracket 24, and a plurality of metering tubes 26 spaced from each other above the container 22.

An outer bottom surface of the bracket 24 has a plurality of supports or rollers (balls 242) so that the container 22 and a solution in it can be slightly shaken. The metering tubes 26 are directly above the container 22 to supply liquid into the container 22 or drip droplets 40 to disturb the liquid in the container 22. A height of a nozzle of each metering tube 26 is adjustable.

As shown in FIG. 4, a tilt angle of the inner bottom surface 22a of the container 22 is defined as θ2. In one embodiment, the tilt angle θ2 is less than 5 degrees. A side wall of the container 22 has a first outlet 222 and a second outlet 224. A height of the second outlet 224 is flush with the inner bottom surface 22a of the container 22, and the first outlet 222 is higher than the second outlet 224. The first outlet 222 and the second outlet 224 are used for metering or discharging the liquid in the container 22. A height difference between the first outlet 222 and the second outlet 224 is defined as a first height h1.

S3: the back plate 10 is placed on the inner bottom surface 22a. The direction of the notch 143 formed by each of the plurality of blocking walls 14 coincides with a direction of an opening 145 of the tilt angle θ2.

Figure 5:
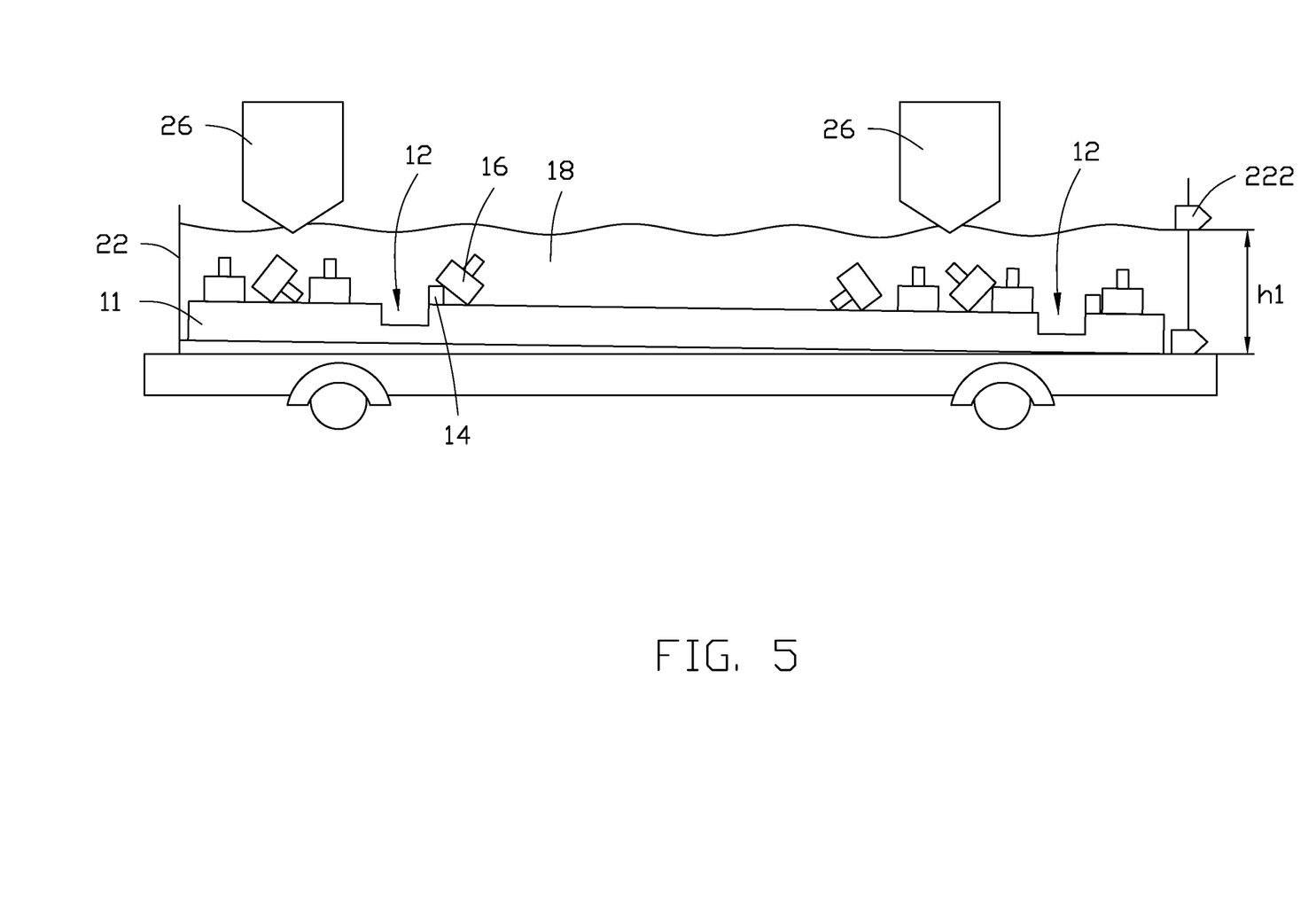
FIG. 5 is an isometric view showing micro light emitting elements in a suspension injected into a container, in Block S4 of the method in FIG. 3.

As shown in FIGS. 4 and 5, since the inner bottom surface 22a of the container 22 is inclined, the back plate 10 is inclined after being placed in the container 22. After the back plate 10 is placed on the inner bottom surface 22a, the direction of the notch 143 of each blocking wall 14 is toward the direction of the opening 145 of the tilt angle θ2.

In one embodiment, the spacing and position of the metering tubes 26 match the spacing and position of the grooves 12 and the blocking walls 14 on the substrate 11. As shown in FIG. 5, each metering tube 26 corresponds to one groove 12, and opposite sides of each of the grooves 12 are provided with one of the metering tubes 26 and one of the blocking walls 14.

S4: a suspension 18 containing a plurality of micro light emitting elements 16 is provided in the container 22.

As shown in FIG. 5, a suspension 18 having the micro light emitting elements 16 is injected into the container 22 by the metering tubes 26. Since each of the grooves 12 corresponds to one of the metering tubes 26, the top surface 11a of the substrate 11 thus has a plurality of micro light emitting elements 16 around each groove 12. In addition, since each metering tube 26 is on a side of each groove 12 not surrounded by the blocking wall 14, the suspension 18 is injected into the periphery of each groove 12 not surrounded by the blocking wall 14 (i.e., a side to which the notch 143 of the blocking wall 14 faces).

In one embodiment, liquid of the first height h1 is injected into the container 22. If the injected liquid is higher than the first height h1, the liquid higher than the first outlet 222 can flow out of the first outlet 222 by opening the first outlet 222, thereby the liquid level is maintained at the first height h1, and the amount of liquid in the container 22 is thereby defined. The liquid may be, for example, one of alcohols, ketones, halogenated hydrocarbons, or water.

After the liquid in the container 22 has the first height h1, the metering tubes 26 are used for sampling, and the suspension 18 with the micro light emitting elements 16 is gently dropped into the container 22.

In one embodiment, block S4 further includes uniformly dispersing the plurality of micro light emitting elements 16 in a solvent to prepare a suspension 18 containing the micro light emitting elements 16. The solvent may be, for example, one of alcohols, ketones, halogenated hydrocarbons, or water.

Figure 6:
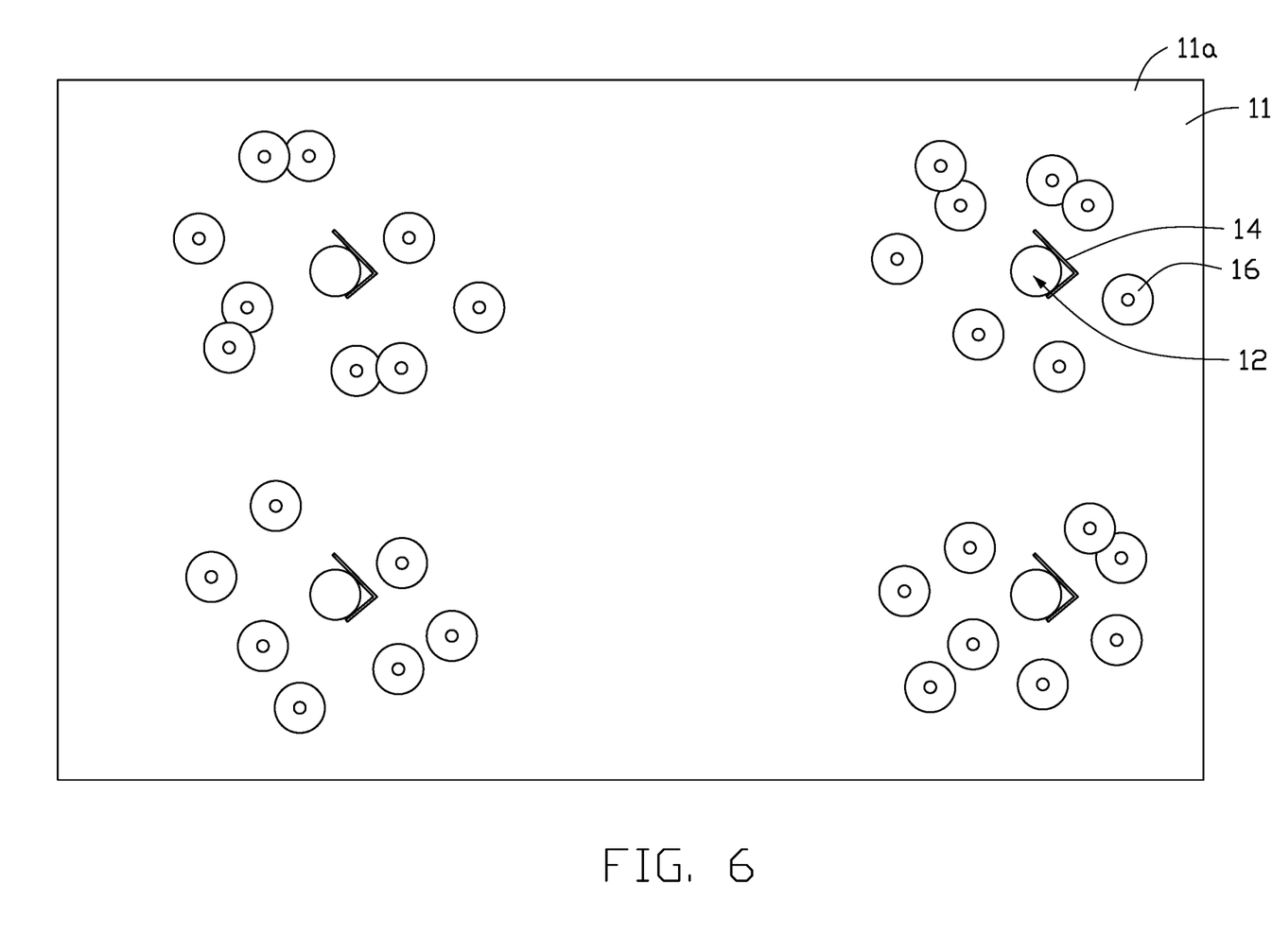
FIG. 6 is a plan view showing a distribution of the micro light emitting elements on the top surface of the substrate when the containing suspension is dropped, as in Block S4 of the method in FIG. 3.

As shown in FIG. 6, some of the micro light emitting elements 16 fallen onto the top surface 11a of the substrate 11 are gathered or overlapped together.

In one embodiment, block S4 further includes using the bracket 24 to shake the container 22 so that the liquid in the container 22 is correspondingly shaken, thereby dispersing the gathered or overlapping micro-light emitting elements 16. The liquid in the container 22 is allowed to settle by standing still for several minutes.

Figure 7:
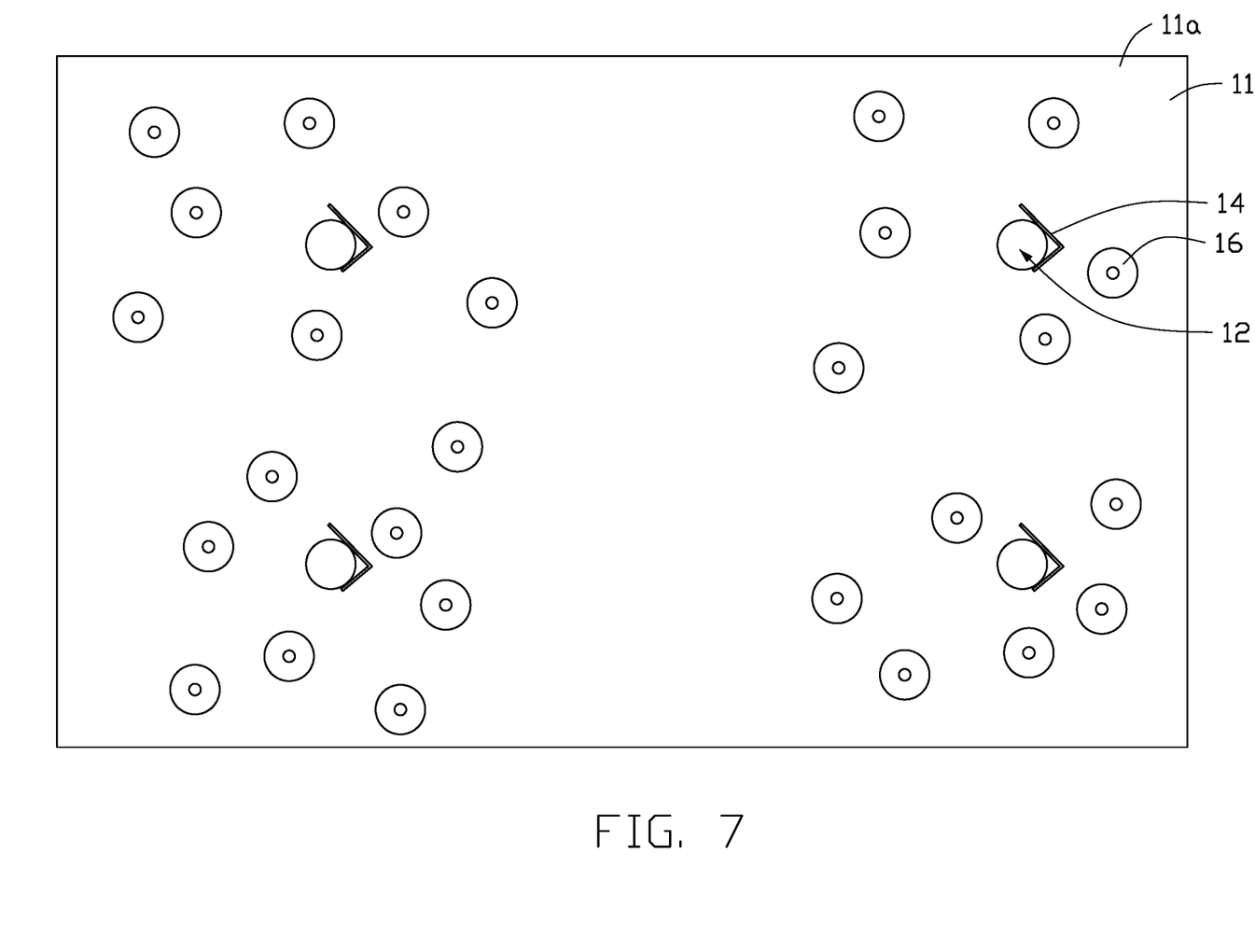
FIG. 7 is a plan view showing a distribution of the micro light emitting elements on the top surface of the substrate after the container has been shaken in Block S4 of the method in FIG. 3.

As shown in FIG. 7, the micro light emitting elements 16 are scattered around the grooves 12 after being shaken.

S5: droplets 40 are dropped into the container 22, so that the micro light emitting elements 16 flow and are transferred into the grooves 12 of the back plate 10. The micro light emitting element 16 moving above one of the grooves 12 is blocked by the blocking wall 14 and falls into the groove 12.

Figure 8:
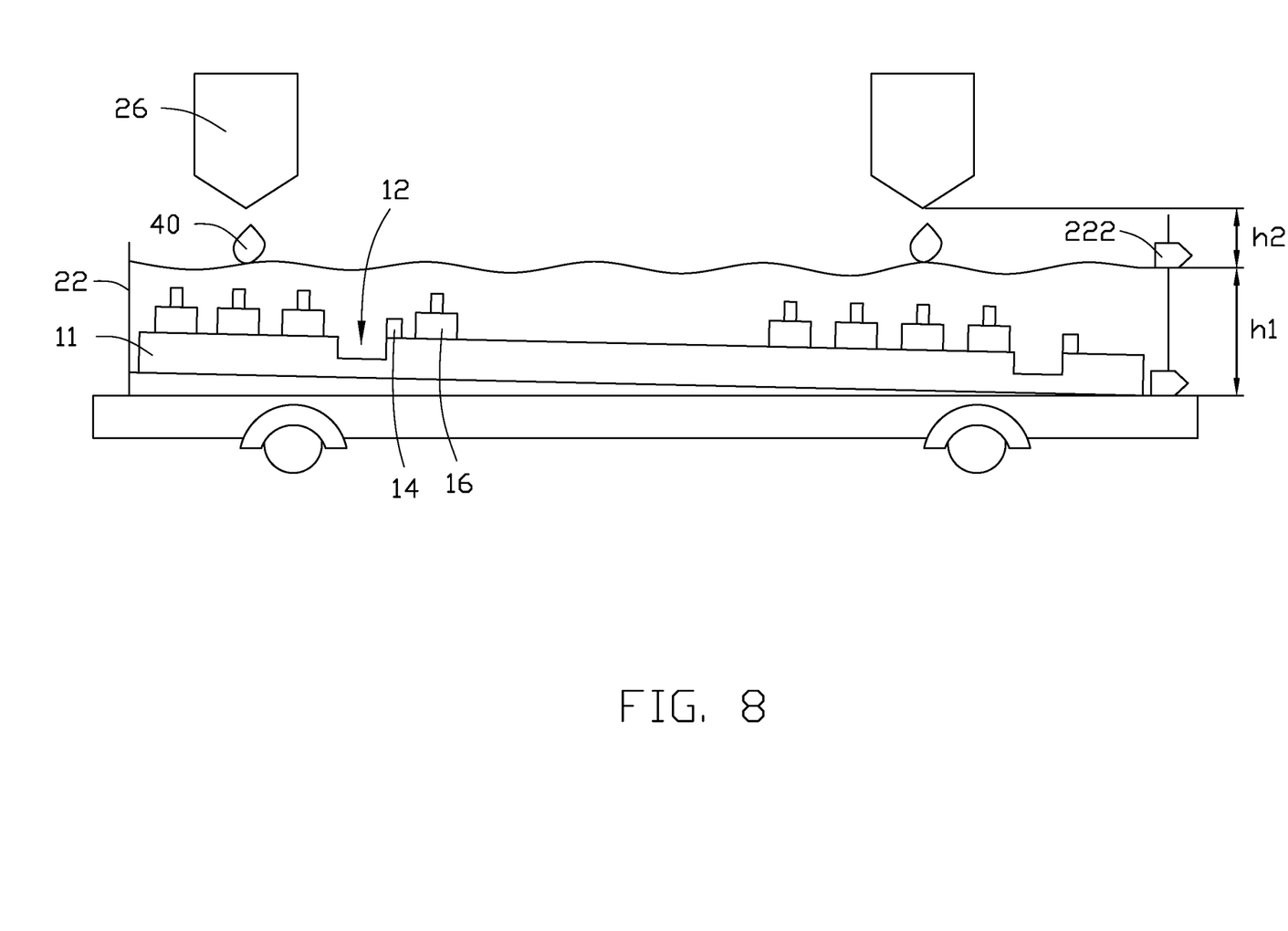
FIG. 8 is an isometric view of adding droplets to the container in Block S5 of the method in FIG. 3.

As shown in FIG. 8, a height of the nozzle of each metering tube 26 is adjusted so that the nozzle of the metering tube 26 is kept above the liquid surface (that is, above the first outlet 222). The height of the nozzle of each metering tube 26 above the liquid surface is defined as a second height h2. Then, the metering tubes 26 are started, and the flow capacity and flow rate of the liquid are adjusted, so that the liquid forms droplets 40 at the nozzle, and the droplets 40 fall to the liquid surface in the container 22 to form a fluid layer, thereby disturbing the micro light emitting elements 16 which are lying on the surface 11a of the substrate 11.

Since the metering tubes 26 are on the side of each groove 12 not surrounded by the blocking walls 14, the droplets 40 are added onto the periphery of each groove 12 not surrounded by the blocking walls 14 (i.e., the side facing the notch 143 of the blocking wall 14). The droplets 40 may be of, for example, alcohol, ketone, halogenated hydrocarbon, or water.

Figure 9:
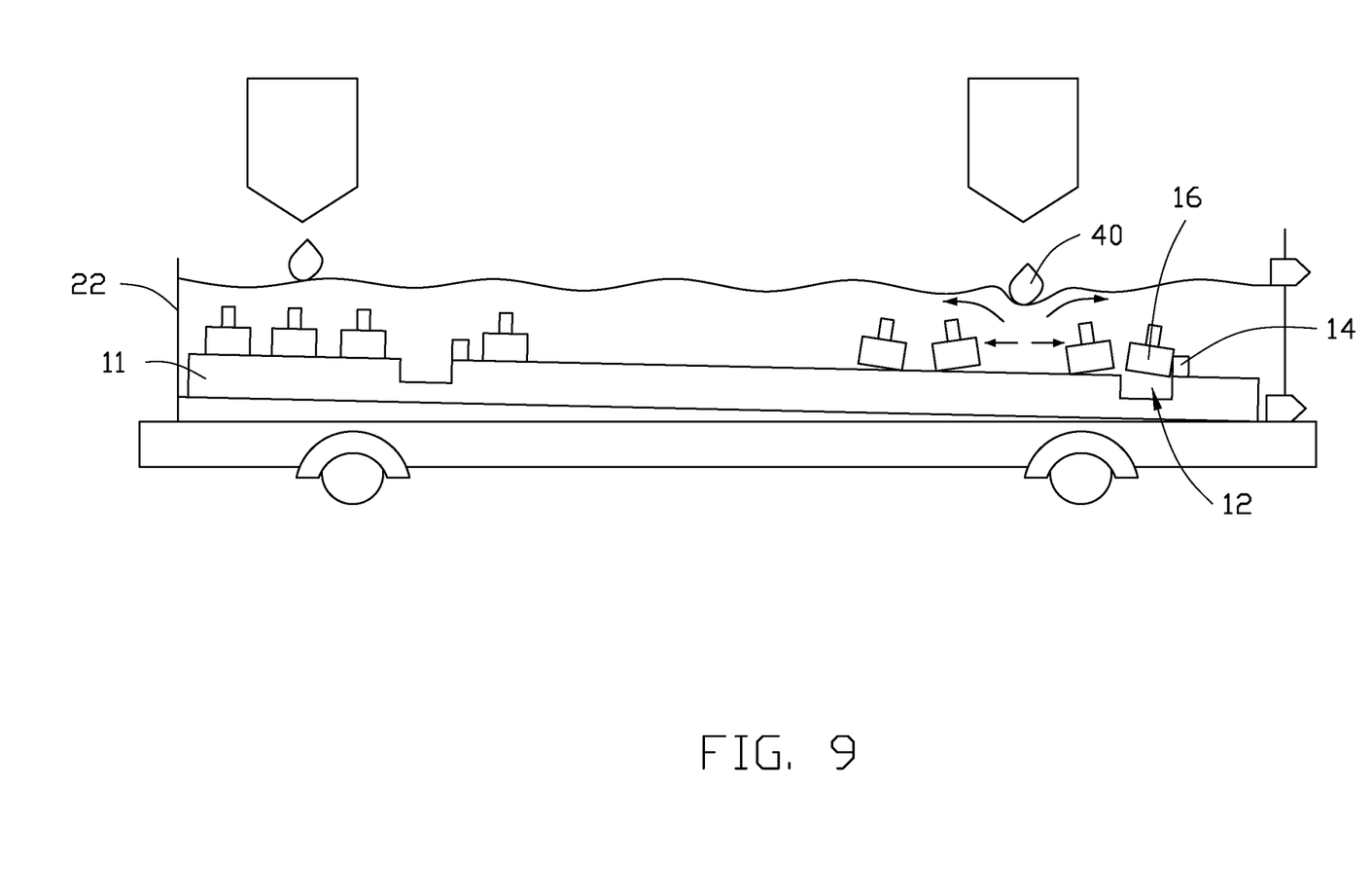
FIG. 9 is an isometric view showing the movement of the micro light emitting elements in the container in Block S5 of the method in FIG. 3.

As shown in FIG. 9, since the inner bottom surface 22a of the container 22 is inclined, after the substrate 11 is placed thereon, opposite ends of the substrate 11 have a height difference, so the liquid in the container 22 will flow in a certain direction. That is, the liquid in the container 22 tends to flow from a higher end of the substrate 11 to a lower end of the substrate 11. The flow of the liquid in the container 22 drives the micro light emitting elements 16 to move, and the micro light emitting elements 16 in the container 22 are advanced toward the groove 12 which is lower due to the fluidity of the layer and the difference in height. Therefore, the probability of the micro light emitting elements 16 entering the grooves 12 is improved. In addition, simple gravity speeds the movements of the droplets 40, thereby reducing the assembly time.

In addition, since the blocking walls 14 effectively block the micro-light emitting elements 16 from reaching the grooves 12, each of the micro-light emitting elements 16 stays at one groove 12 and completely and directly occupies the groove 12. The probability of the micro light emitting elements 16 entering the grooves 12 is further increased, and the time for assembly is further reduced.

In one embodiment, block S5 is repeated until each groove 12 on the substrate 11 is occupied by one micro light emitting element 16.

Figure 10:
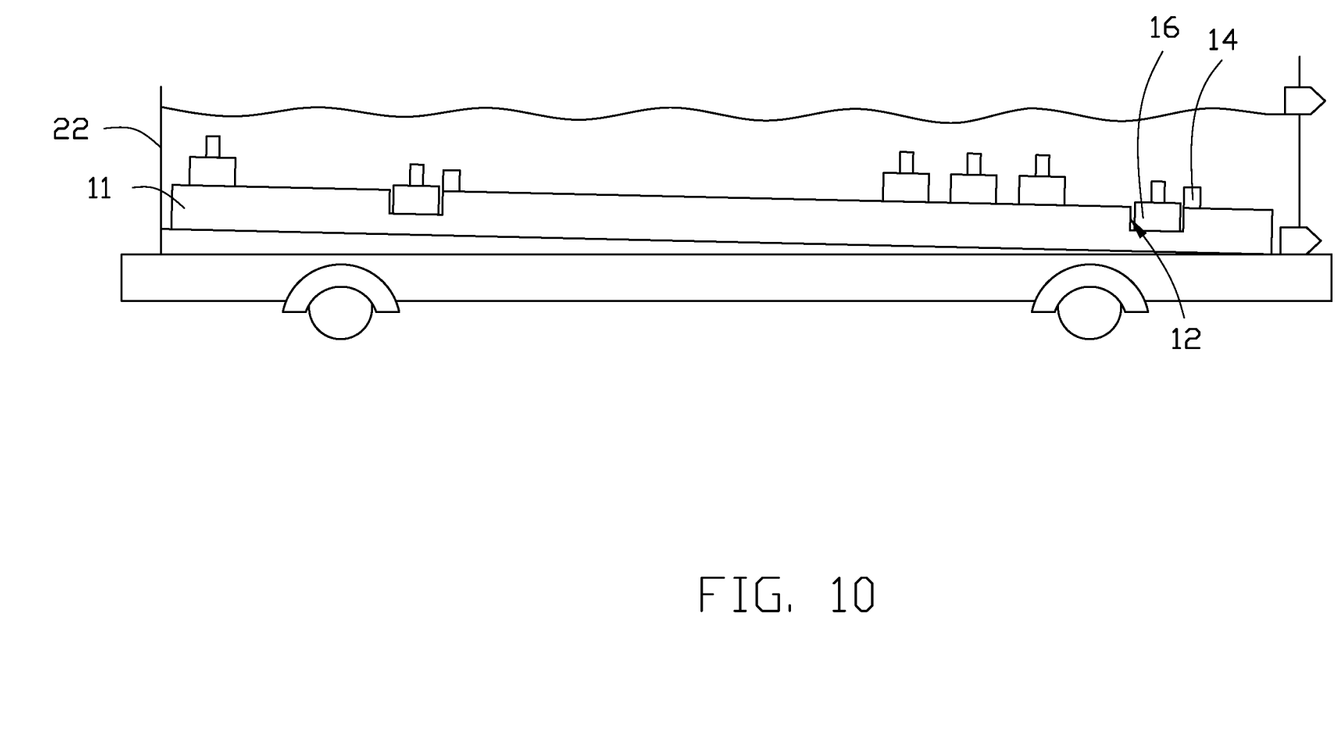
FIG. 10 is an isometric view showing every groove in the substrate occupied by one micro light emitting element in Block S5 of the method in FIG. 3.

As shown in FIG. 10, some micro light emitting elements 16 fall into the grooves 12, and some micro light emitting elements 16 remain on the top surface 11a of the substrate 11.

Figure 11:
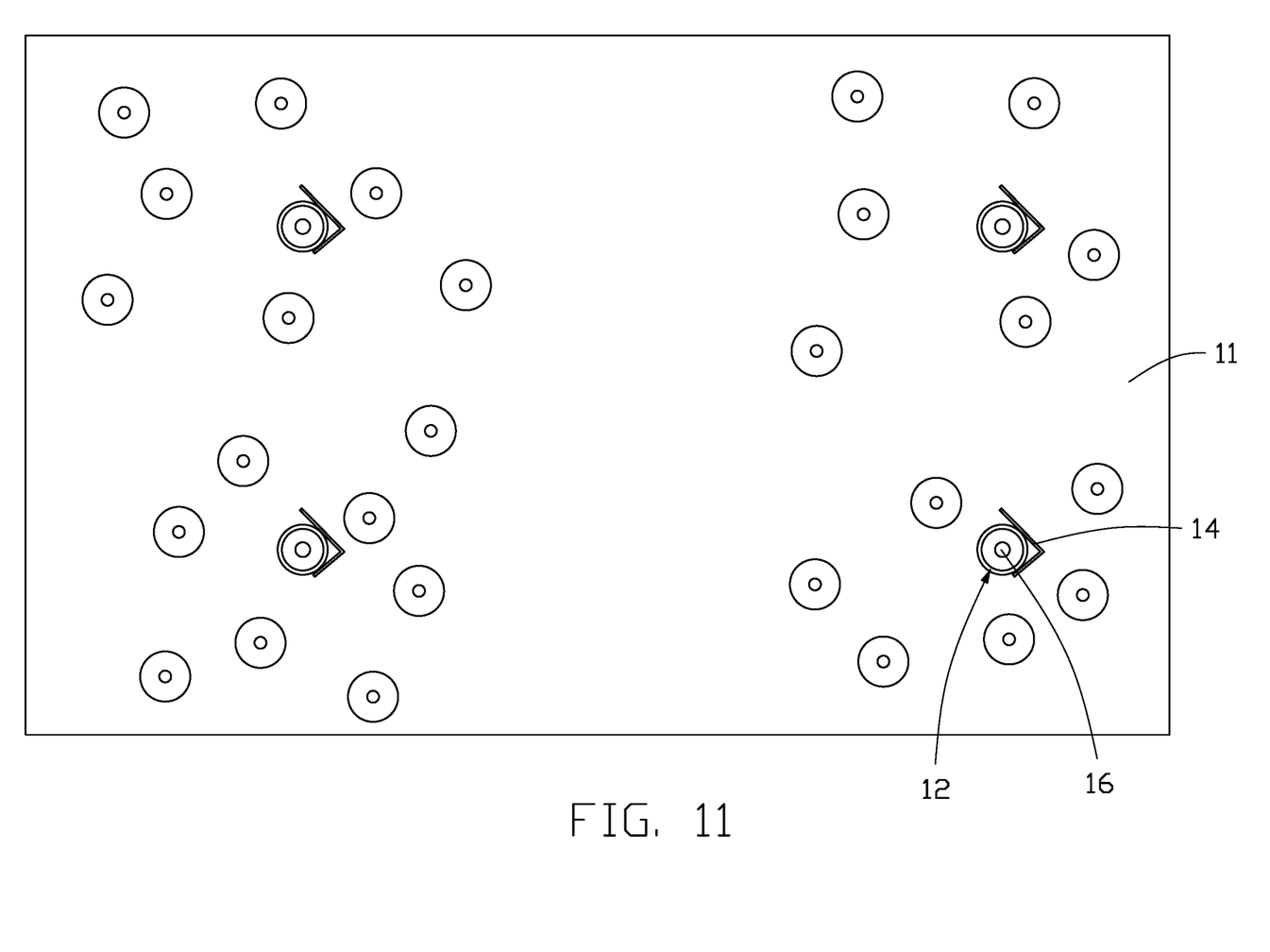
FIG. 11 is a top view of the back plate shown in FIG. 10.

FIG. 11 is a top view of the back plate 10 shown in FIG. 10. As shown in FIG. 11, each groove 12 is occupied by one micro light emitting element 16. After all the grooves 12 on the back plate 10 are occupied by a micro light emitting element 16, there are still micro light emitting elements 16 remaining on the top surface 11a of the substrate 11.

In one embodiment, the assembly method further includes the step of removing and collecting the micro light emitting elements 16 which are not required.

Figure 12:
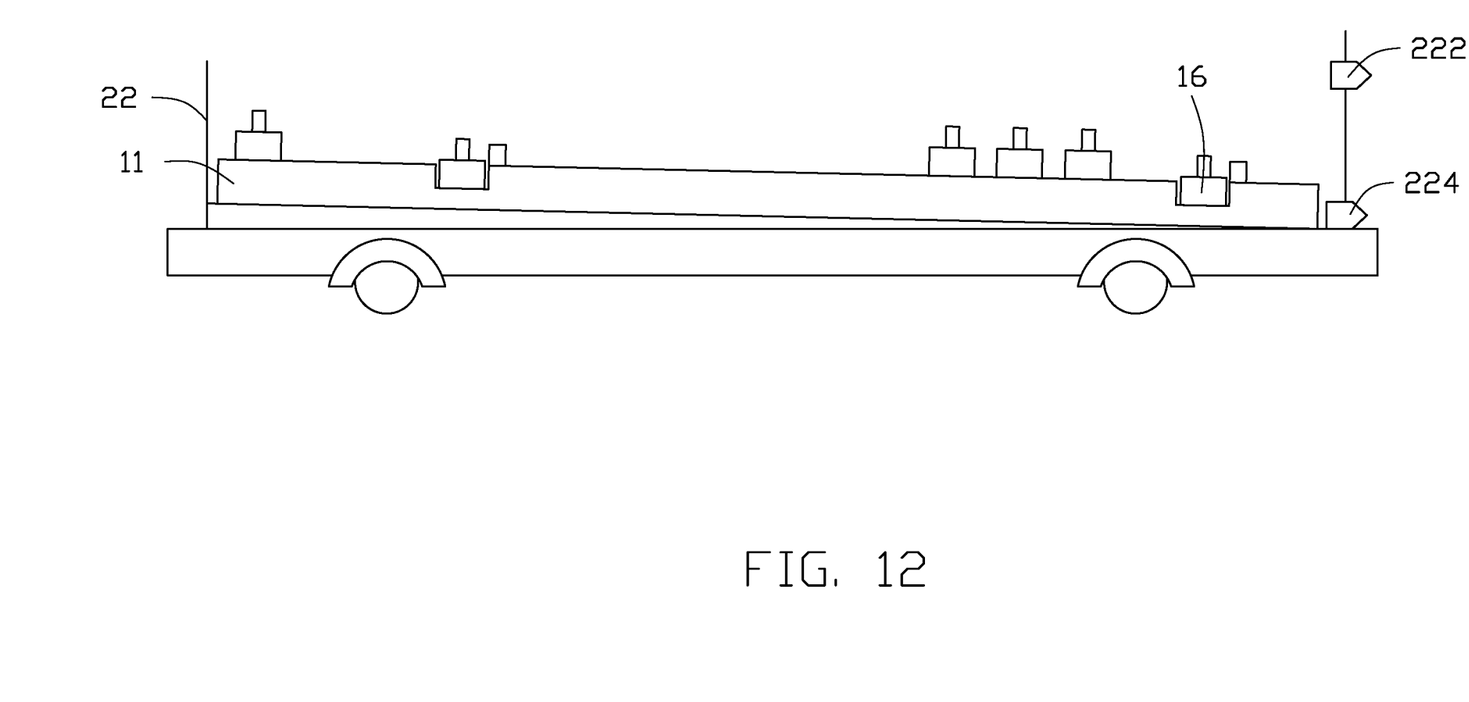
FIG. 12 is an isometric view showing liquid in the container removed, as in Block S5 of the method in FIG. 3.

As shown in FIG. 12, after each of the grooves 12 is occupied by one micro light emitting element 16, the second outlet 224 is opened, so that the liquid in the container 22 slowly flows out from the second outlet 224.

Figure 13:
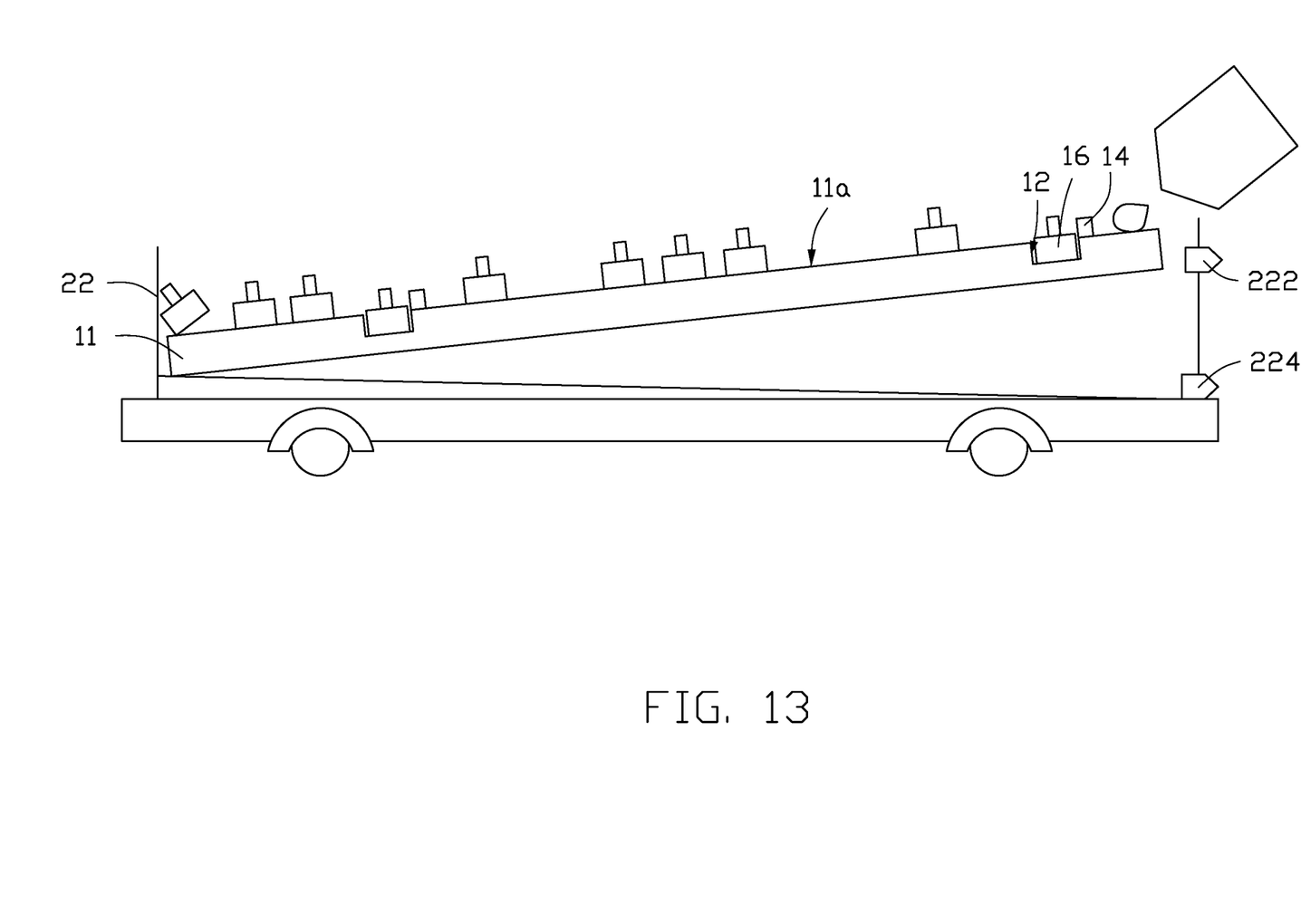
FIG. 13 is an isometric view showing excess micro light emitting elements removed, as in Block S5 of the method in FIG. 3.

As shown in FIG. 13, after the liquid in the container 22 is discharged, the back plate 10 is tilted in the opposite direction (that is, the lower end of the back plate 10 is lifted). The top surface 11a of the substrate 11 is then rinsed with liquid which removes remaining and excess micro light emitting elements 16 into a collection tank (not shown). The blocking wall 14 protects the micro light emitting element 16 in each groove 12 from being washed away.

Since a side of each groove 12 of the back plate 10 is provided with the blocking wall 14, the inner bottom surface 22a of the container 22 has a tilt angle θ2, so that the flow of the droplets 40 is directional, and the micro light emitting elements 16 are directed toward the grooves 12. A hole penetration rate of the micro light emitting elements 16 is improved, the assembly yield is increased, and the assembly time is reduced. In addition, this assembly method effectively collects the excess micro light emitting elements 16 on the top surface 11a of the substrate 11 and increases the overall utilization rate of the micro light emitting elements 16. Moreover, the blocking walls 14 also protects the micro-light emitting elements 16 in each groove 12 during recycling of the micro-light emitting elements 16. During the process of recovering the excess of micro light emitting elements 16, the likelihood of the liquid flushing out the micro light emitting elements 16 seated in the grooves 12 is reduced.

Figure 14:
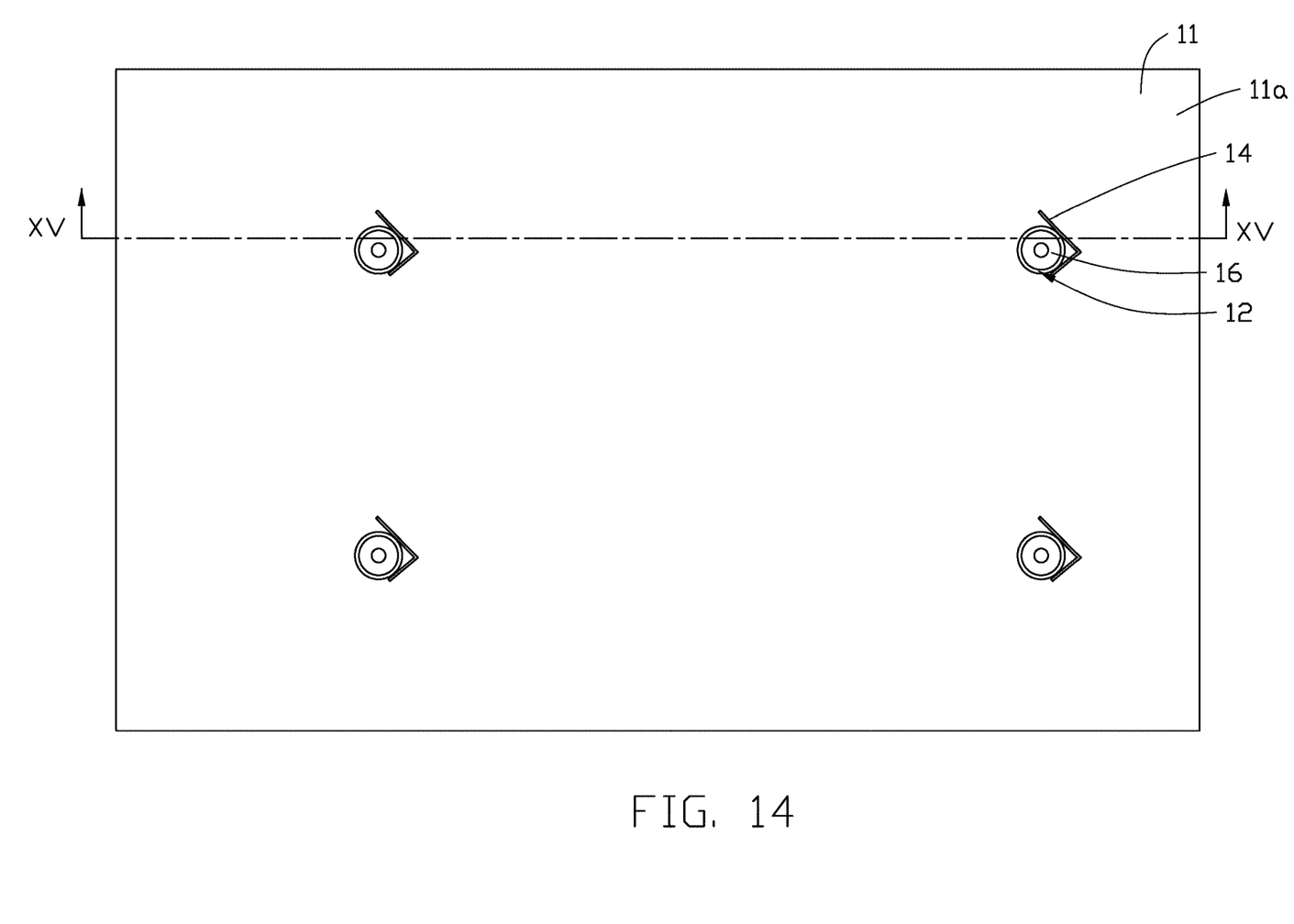
FIG. 14 is a plan view showing an application of Block S5 of the method as applied to the back plate.

As shown in FIG. 14, after assembly of the back plate 10 is completed, each groove 12 has one micro light emitting element 16 therein. In one embodiment, the back panel 10 is used as a display after assembling the micro-light emitting elements 16. In other embodiments, the back panel 10 is used as a backlight in a liquid crystal display after the assembly.

Figure 15:
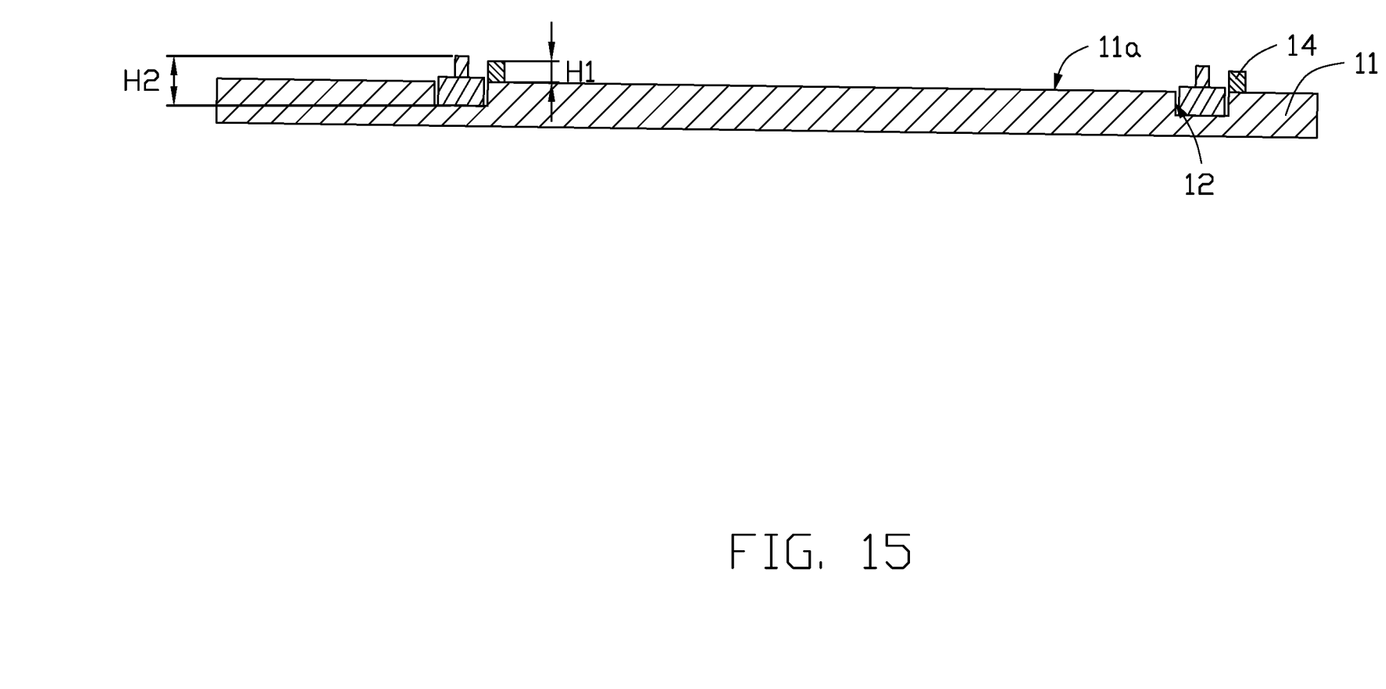
FIG. 15 is a cross-sectional view along line XV-XV of FIG. 14.

FIG. 15 is a cross-sectional view along line XV-XV of FIG. 14. As shown in FIG. 15, each micro light emitting element 16 has a portion beyond the top surface 11a of the substrate 11 after falling into the grooves 12. In a thickness direction of the substrate 11, the height H1 of each blocking wall 14 is greater than half of the height H2 of each micro-light emitting element 16, so that each micro-light emitting element 16 is effectively blocked by the blocking wall 14 and more likely to fall into one of the grooves 12.

It is to be understood, even though information and advantages of the present exemplary embodiments have been set forth in the foregoing description, together with details of the structures and functions of the present exemplary embodiments, the disclosure is illustrative only. Changes may be made in detail, especially in matters of shape, size, and arrangement of parts within the principles of the present exemplary embodiments to the full extent indicated by the plain meaning of the terms in which the appended claims are expressed.

What is claimed is:
1. A method for fluid-assisted assembly, comprising:
providing a back plate, wherein the back plate comprises a substrate having a driving circuit and a plurality of blocking walls protruding from a top surface of the substrate, the top surface of the substrate defines a plurality of grooves for accommodating micro light emitting elements, each of the plurality of blocking walls partially surrounds one of the plurality of grooves and defines an notch, and the notches defined by each of the plurality of blocking walls each face a single direction;
providing a container, wherein an inner bottom surface of the container has an inclined angle;
placing the back plate on the inner bottom surface of the container so that a direction of the notch defined by the plurality of retaining walls consistent with a direction of the opening at the inclined angle;
providing a suspension containing a plurality of micro light emitting elements in the container; and
dropping droplets into the container such that the plurality of micro light emitting elements flow and are transferred into the plurality of grooves, wherein each of the plurality of micro light emitting elements moving above one of the plurality of grooves is blocked by one of the plurality of blocking walls, and falls into one of the plurality of grooves.

2. The method for fluid-assisted assembly according to claim 1, wherein the suspension is injected into the periphery of each of the plurality of grooves not surrounded by the plurality of retaining walls.

3. The method for fluid-assisted assembly according to claim 1, wherein the droplets are added into the periphery of each of the plurality of grooves not surrounded by the plurality of retaining walls.

4. The method for fluid-assisted assembly according to claim 1, further comprising shaking the container to disperse the plurality of micro light emitting elements after the suspension is provided in the container.

5. The method for fluid-assisted assembly according to claim 1, wherein after each of the plurality of grooves is occupied by one of the micro light emitting elements, the back plate is tilted in a reverse direction, and the top surface of the substrate is rinsed with liquid to remove excess micro light emitting elements.

6. The method for fluid-assisted assembly according to claim 1, wherein each of the plurality of blocking walls comprises a first blocking wall portion and a second blocking wall portion connected to the first blocking wall portion, the first blocking wall portion intersects with the second blocking wall portion to form the notch.

7. The method for fluid-assisted assembly according to claim 6, wherein an intersection angle between the first blocking wall portion and the second blocking wall portion ranges from 45 degrees to 120 degrees.

8. The method for fluid-assisted assembly according to claim 1, wherein a height of each of the plurality of blocking wall is greater than half a height of each of the micro light emitting elements along a thickness direction of the substrate.

9. The method for fluid-assisted assembly according to claim 1, wherein each of the plurality of grooves is substantially cylindrical, and a distance between adjacent ones of the plurality of grooves is not less than twice the diameter of each of the plurality of grooves.

* * * * *